United States Patent [19]

Cliff

[11] Patent Number: 5,237,219
[45] Date of Patent: Aug. 17, 1993

[54] METHODS AND APPARATUS FOR PROGRAMMING CELLULAR PROGRAMMABLE LOGIC INTEGRATED CIRCUITS

[75] Inventor: Richard G. Cliff, Santa Clara, Calif.
[73] Assignee: Altera Corporation, San Jose, Calif.
[21] Appl. No.: 880,908
[22] Filed: May 8, 1992
[51] Int. Cl.⁵ .......................................... H03K 19/173
[52] U.S. Cl. .................................... 307/465; 307/443; 365/221; 365/230.08; 365/189.05
[58] Field of Search ................................ 307/465, 443; 365/230.08, 239, 189.05, 221; 371/22.2

[56] References Cited

U.S. PATENT DOCUMENTS

| | | | |
|---|---|---|---|
| 4,805,139 | 2/1989 | Norris | 365/221 |
| 4,864,544 | 9/1989 | Spak et al. | 365/189.05 |
| 5,021,689 | 6/1991 | Pickett et al. | 307/465 |
| 5,055,710 | 10/1991 | Tanaka et al. | 307/465 |
| 5,065,363 | 11/1991 | Sato et al. | 365/189.05 |
| 5,095,462 | 3/1992 | Norris | 365/221 |

Primary Examiner—Edward P. Westin
Assistant Examiner—Jon Santamauro
Attorney, Agent, or Firm—Robert R. Jackson

[57] ABSTRACT

In order to simplify the programming structure and facilitate testing of that structure, the programmable elements in a cellular programmable logic integrated circuit (such as a field programmable gate array ("FPGA") or a programmable logic device ("PLD")) are connected in one or more series with switches interposed between the elements in the series. Initially, all of the switches in each series are enabled so that the ability of the series to correctly pass data can be tested. Thereafter, the switches are progressively disabled, starting from the switch which is most remote from the data source, so that data is stored in successive programmable elements, again starting with the programmable element which is most remote from the data source.

11 Claims, 2 Drawing Sheets

METHODS AND APPARATUS FOR PROGRAMMING CELLULAR PROGRAMMABLE LOGIC INTEGRATED CIRCUITS

BACKGROUND OF THE INVENTION

This invention relates to methods and apparatus for programming cellular programmable logic integrated circuits such as field programmable gate arrays ("FPGAs") and many kinds of programmable logic devices ("PLDs").

Extremely powerful and flexible cellular programmable logic circuit architectures are known as shown, for example, by commonly assigned, co-pending application Ser. Nos. 754,017, filed Sep. 3, 1991, and 880,942, filed May 8, 1992, both of which are hereby incorporated by reference herein. These architectures include large numbers of logic modules, each of which is programmable to perform any of several relatively elementary logic functions. An extensive network of conductors is provided for programmably interconnecting these logic modules in order to provide much more complex logic functions. These logic circuits include very large numbers of programmable elements. Each logic module has a substantial number of these elements, and the interconnection network also requires many such elements to produce the desired interconnections between logic modules.

A typical technique for programming the programmable elements in devices of the type described above is to employ shift registers as shown, for example, in Wahlstrom U.S. Pat. No. 3,473,160 and Freeman U.S. Pat. No. 4,870,302. Each shift register stage controls an associated logic or switching element. Programming data is shifted through the shift register or registers until the data desired for controlling each logic or switching element is stored in the shift register stage associated with that element. A disadvantage of this approach is that shift registers are relatively complex and require substantial numbers of conductors for interstage data transfer, clocking, etc. Thus in complex logic circuit structures, the shift register approach to programming may take up excessive space and other resources, and may even become a limiting factor in the design of the device. The testing of shift register programmed devices is also relatively cumbersome because the shift register can only be tested by shifting data all the way through it. If, as is common in very complex logic circuits, the shift registers are long, it may take a relatively long time to shift test data through them.

In view of the foregoing, it is an object of this invention to provide improved techniques for programming cellular programmable logic circuits.

It is a more particular object of the invention to simplify the structures used for programming cellular programmable logic circuits.

It is still another more particular object of this invention to provide cellular programmable logic circuit programming techniques which facilitate testing of the device.

SUMMARY OF THE INVENTION

These and other objects of the invention are accomplished in accordance with the principles of the invention by connecting multiple programmable elements in a cellular programmable logic integrated circuit in a series in which the serial interconnections are controlled by addressable switches. The first addressable switch in each series is connected to a data source such as one element of a data register. The output of the last programmable element in each series may be connected to a test point such as one element of a test register. To test the operation of each series, all of the programmable switches are turned on. If all of the programmable elements in the series are working properly, data from the data source will flow through the series and appear at the test point. This will not happen if any programmable element in the series is defective.

The programmable elements in the series are programmed one after another starting with the one which is most remote from the data source. This most remote element is programmed by turning on all the programmable switches and having the data source supply the data desired for storage in the most remote programmable element. Because all of the programmable switches are on, this data flows through all of the programmable elements to the most remote one. The programmable switch just upstream from the most remote programmable element is then turned off and the data source supplies the data desired for storage in the second-most-remote programmable element. This data flows through the series of programmable elements to the second-most-remote programmable element. The most remote programmable element is unaffected and continues to store the previously applied data because the programmable switch upstream from it has been turned off. The programmable switch upstream from the second-most-remote programmable element is now turned off and the data source supplies the data to be stored in the third-most-remote programmable element. This process continues until the desired data has been stored in all of the programmable elements and all of the programmable switches have been turned off. Any number of series of programmable elements can be programmed at the same time in parallel.

It will be apparent that the above-described methods and apparatus eliminate the need for separate shift registers for each series of programmable elements, thereby simplifying the programming structure. In addition, testing of the programmable elements is greatly facilitated by initially passing data through several programmable elements connected in series in order to simultaneously and virtually instantaneously test all of those programmable elements.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
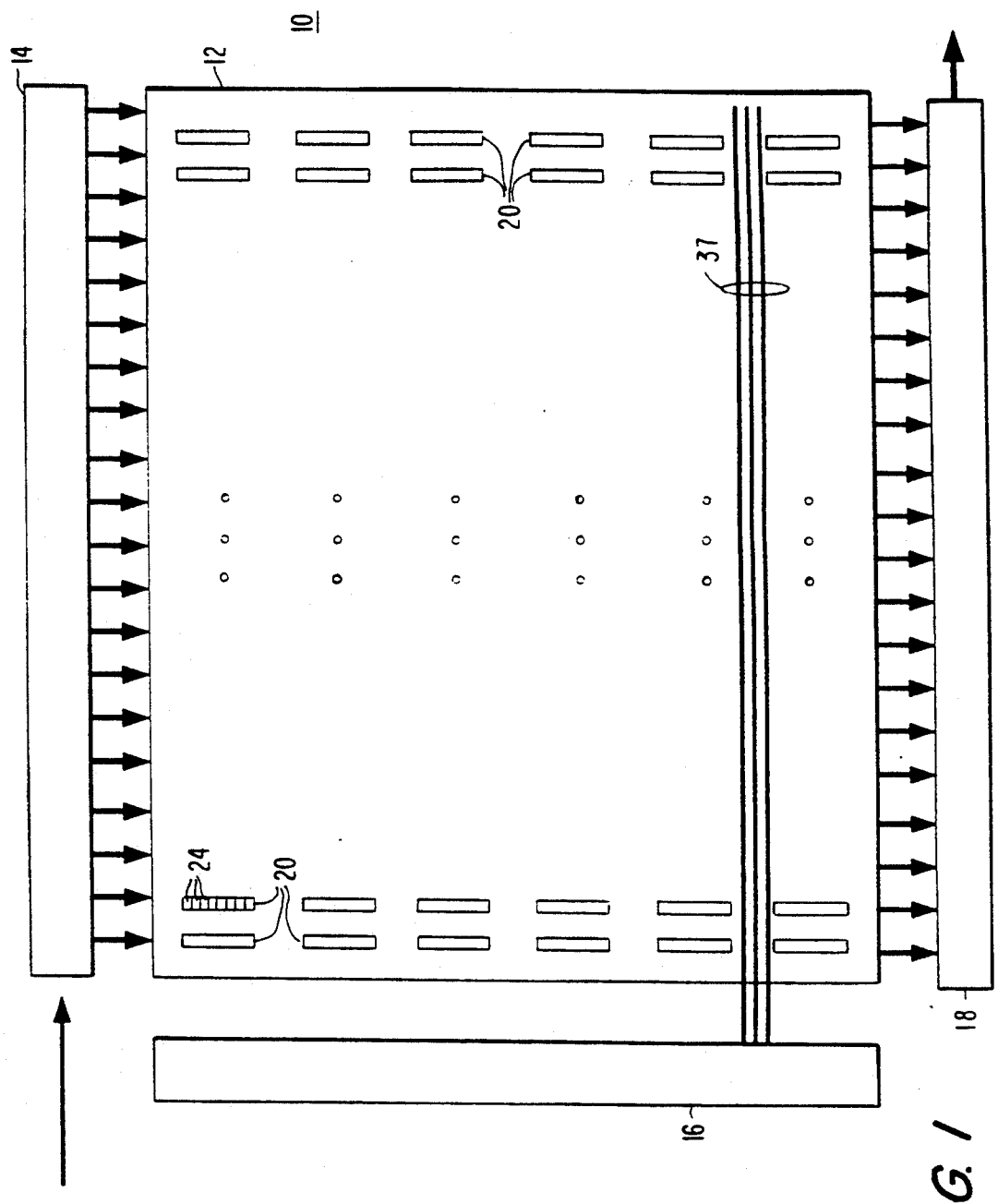
FIG. 1 is a simplified schematic block diagram of an illustrative cellular programmable logic integrated circuit constructed in accordance with the principles of this invention.

FIG. 1 shows a cellular programmable logic integrated circuit 10 of a type shown in abovementioned application Ser. No. 880,942, with added features in accordance with the present invention. Although this particular type of circuit is shown herein for purposes of illustration, it will be understood that the principles of this invention are equally applicable to a wide variety of programmable logic circuits such as field programmable gate arrays ("FPGAs") and programmable logic devices ("PLDs"), all of which are referred to generically herein as cellular programmable logic circuits.

Circuit 10 includes a main logic portion 12, a data register 14, an address register 16, and a test register 18. Main portion 12 includes 132 logic array blocks or LABs 20 arranged in six rows of 22 LABs per row. Each LAB includes eight logic modules 24. Each logic module can be programmed to perform a desired relatively elementary logic function. For example, each logic module may include a look up table for providing any desired output in response to any one of the 16 possible combinations of four inputs. More complex logic functions can be performed by using a programmable network of conductors (not shown) to interconnect the individual logic modules and LABs in any of a wide variety of ways. More detail regarding the main portion 12 of circuit 10 will be found in the immediately above-mentioned reference, but these details are not necessary for understanding or practicing the present invention. It is sufficient to appreciate that main portion 12 (like many other devices of this general type) has many elements (called function control elements or FCEs in the immediately above-mentioned reference) requiring programming. For example, each of the above-mentioned look up tables has 16 programmable elements. Additional programmable elements may be used for many other purposes throughout the circuit such as selecting the interconnections to be made between logic modules 24 and LABs 20, controlling switches within the logic modules and LABs, determining whether logic modules will register or simply pass through data, etc. In a circuit of the size and type described above there could easily be over 300 rows and over 700 columns of programmable elements.

Figure 2:
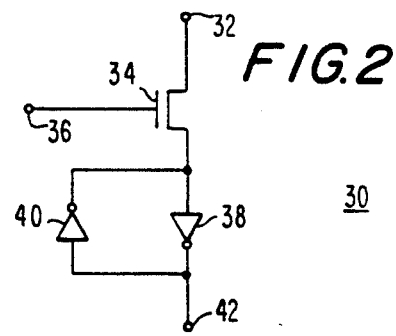
FIG. 2 is a schematic diagram of a programmable element which can be used in the circuit of FIG. 1

FIG. 2 shows a typical programmable element 30 which can be used in circuit 10. Programmable element 30 is a conventional static random access memory or SRAM element. Data is applied to terminal 32. N-channel transistor 34 can be turned on by a suitable address signal applied to terminal 36. When transistor 34 is turned on, the data applied to terminal 32 is applied to the input terminal of relatively strong inverter 38. Relatively weak inverter 40, connected in a feedback relationship with inverter 38, is not strong enough to prevent inverter 38 from responding to the data from terminal 32, but is strong enough to maintain inverter 38 in whatever state it is placed by the terminal 32 data when transistor 34 is turned off again. Accordingly, programmable element 30 stores the data applied to it. That data is available (in inverted form) at terminal 42.

Figure 3:
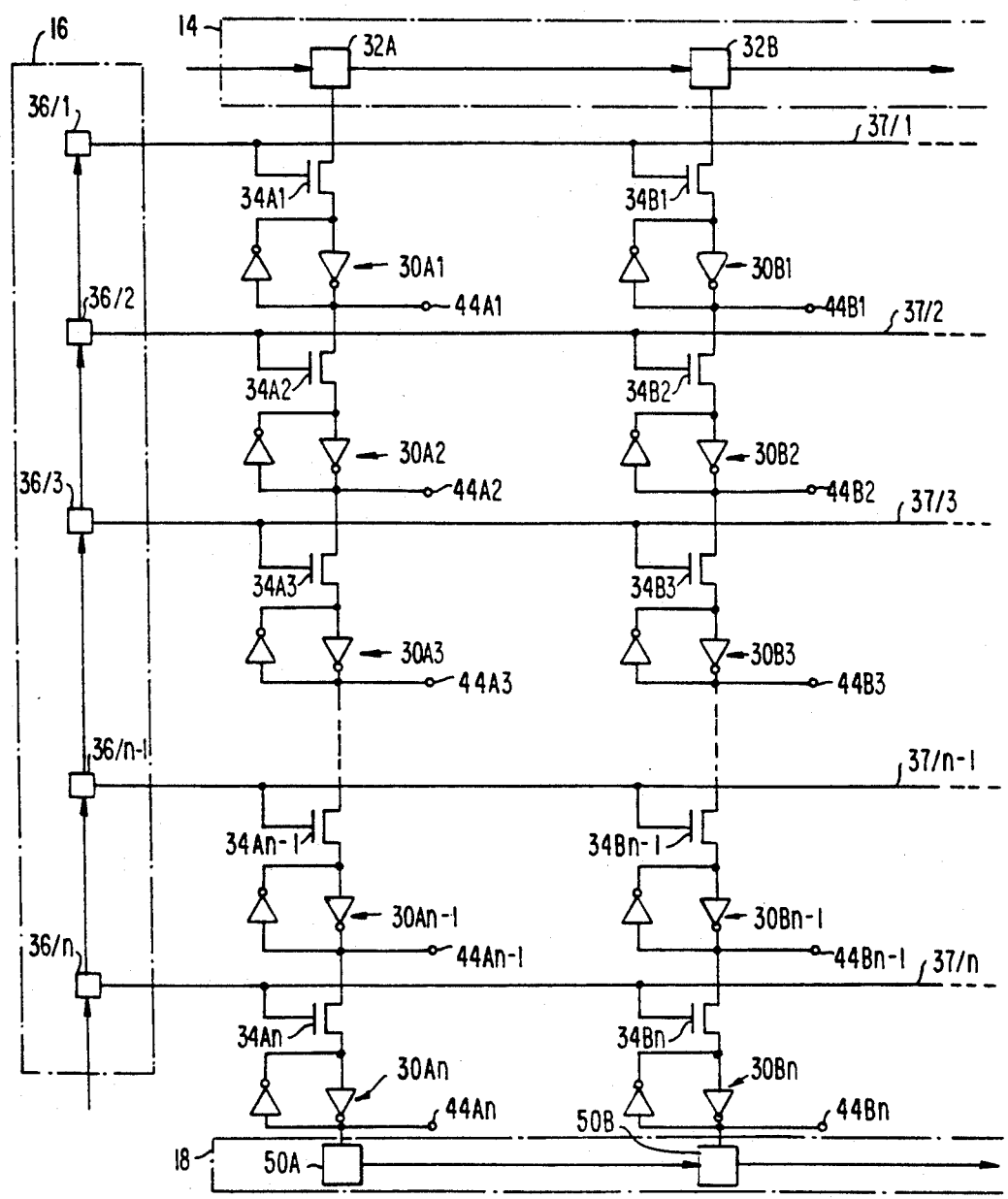
FIG. 3 is a schematic diagram showing how a plurality of programmable elements of the type shown in FIG. 2 can be interconnected and controlled in accordance with this invention.

In order to avoid having to provide a separate data input conductor to each of the large number of programmable elements typically required in field programmable gate array circuits of the type shown in FIG. 1, subsets of these programmable elements are connected in series in accordance with this invention as shown in FIG. 3. Two representative series are shown in FIG. 3 with vertical alignment. The first of these series includes data register element 32A, programmable elements 30A1 through 30An, and test register element 50A. The second series includes data register element 32B, programmable elements 30B1 through 30Bn, and test register element 50B. Elements 32 collectively comprise data register 14 in FIG. 1 and, if desired, may form a shift register as suggested by the arrows extending from left to right. Elements 50 collectively comprise test register 18 in FIG. 1 and may also be connected to one another to form a shift register if desired. All of transistors 34A1, 34B1, etc., are controlled by address register element 36/1 via address conductor 37/1. All of transistors 34A2, 34B2, etc., are controlled by address register element 36/2 via address conductor 37/2. This sharing of address elements continues to the ends of the series. Elements 36 collectively comprise address register 16 in FIG. 1, which may also be a shift register as suggested by the arrows from the bottom to the top in FIG. 3.

In typical operation, test data is first loaded into data register 14, and all of transistors 34 are rendered conducting by appropriate address information in address register 16. With all of programmable elements 30A connected in series and all of transistors 34A conducting, the data in data register elements 32A passes through elements 30A to test register element 50A, assuming that all of elements 30A are operating properly. (The data received by element 50A will be inverted if n is odd or uninverted if n is even.) The B series similarly passes data from data register element 32B to test register element 50B. Accordingly, the proper replication of the data register data in test register 18 indicates that programmable elements 30 are operating properly, at least to the extent that they are able to receive and pass on data. If any series of elements 30 is not operating properly to this extent, that will be indicated by the failure of the associated test register element 50 to receive the intended data from the associated data register element 32. Each series of programmable elements 30 may be tested with data of both polarities. If registers 14 and 18 are shift registers, the desired data may be shifted into data register 14 from left to right, and shifted out of test register 18, also from left to right.

After testing as described above, data can be stored in programmable elements 30 as will now be described. Programmable elements 30An, 30Bn, etc., are the first to store data. This is done by loading the desired data (or its complement, depending on the number of inverter stages above the programmable elements to receive the data) in data register 14. All of transistors 34A1–34An, 34B1–34Bn, etc., are turned on by appropriate address information stored in address register 16. The data in each data register element 32 therefore passes through all of the associated programmable elements 30 to the bottom-most element 30An, 30Bn, etc. The transistors 34An, 34Bn, etc., immediately above elements 30An, 30Bn, etc., are then turned off by an appropriate change in the address information in address element 36/n in order to latch the data into elements 30An, 30Bn, etc.

The next programmable elements to store data are elements 30An-1, 30Bn-1, etc. The desired data is loaded in register 14. All of transistors 34 are turned on except transistors 34An, 34Bn, etc. This transfers the data from register 14 to elements 30An-1, 30Bn-1, etc. This data is latched into these programmable elements by turning off transistors 34An-1, 34Bn-1, etc.

The foregoing process is repeated, working up the series of programmable elements 30 as viewed in FIG. 3, until data has been stored in all of the programmable elements. This process may be facilitated by constructing address register 16 as a shift register and gradually filling it up with zeros from the bottom to the top as viewed in FIG. 3 in order to progressively turn off transistors 34 (assuming that zeros in register 16 turn off transistors 34). The data stored in each programmable element 30 is available at the associated terminal 44 for use in controlling a look up table element, a switch, or any other programmable function in the associated field programmable gate array 10. For example, referring to above-mentioned application Ser. No. 880,942, the signals applied to terminals 44 can be variously used as the outputs of FCEs 44 (FIG. 4), as the outputs of FCEs 51 and 57 (FIG. 2), etc.

It will be understood that the foregoing is merely illustrative of the principles of this invention, and that various modifications can be made by those skilled in the art without departing from the scope and spirit of the invention. For example, although the invention has been illustrated in the context of a particular cellular programmable logic circuit architecture, it will be understood that the invention is equally applicable to many other types of cellular programmable logic circuits.

The invention claimed is:

1. Apparatus for controlling a plurality of programmable functions in a cellular programmable logic circuit comprising:
   a plurality of electronically programmable elements, each including data storage means and switch means for selectively applying data applied to the switch means to the associated data storage means, said programmable elements being connected in series with one another so that the data in the storage means in each programmable element is applied to the switch means of the succeeding programmable element in the series, the data in the storage means in each programmable element controlling a respective one of the programmable functions in the cellular programmable logic circuit;
   means for applying data to the switch means of a first of the programmable elements in the series; and
   means for initially enabling all of said switch means and then progressively disabling said switch means starting with the switch means of the programmable element which is most remote from said first programmable element and working toward said first programmable element so that data from said means for applying passes serially through all of said programmable elements having enabled switch means and is stored in the programmable element whose switch means is next disabled.

2. The apparatus defined in claim 1 wherein each of said storage means comprises:
   a first relatively strong inverter having an input terminal and an output terminal, said input terminal being connected to the switch means of the associated programmable element, and said output terminal being connected to the switch means of the next succeeding programmable element in the series; and
   a second relatively weak inverter having an input terminal connected to the output terminal of the first inverter and an output terminal connected to the input terminal of the first inverter, said second inverter being too weak to prevent said first inverter from switching in response to data applied by the switch means of the associated programmable element, but strong enough to hold said first inverter in the state produced by said data when the switch means of the associated programmable element is disabled.

3. The apparatus defined in claim 1 wherein said means for applying comprises a data register element.

4. The apparatus defined in claim 3 wherein said data register element is an element of a data shift register.

5. The apparatus defined in claim 1 further comprising:
   a test register element for receiving and storing the data passed through all of said programmable elements in said series.

6. The apparatus defined in claim 5 wherein said test register element is an element of a test shift register.

7. The apparatus defined in claim 1 wherein said means for initially enabling comprises an address register having a plurality of address register elements, each of said address register elements controlling a respective one of said switch means.

8. The apparatus defined in claim 7 wherein said address register elements are connected to one another so as to form an address shift register.

9. The apparatus defined in claim 1 wherein said series is one of a plurality of similar series of programmable elements, and wherein said means for initially enabling controls the switch means in each of said series in the same way at the same time.

10. The method of programming a cellular programmable logic circuit having a plurality of functions respectively controlled by a plurality of programmable elements connected in series so that data in each programmable element can be applied to the next programmable element in the series via switches connected between adjacent programmable elements in the series, said method comprising the steps of:
    (a) enabling all of said switches;
    (b) applying data to a first of the programmable elements in the series so that said data passes through all of said programmable elements to the programmable element which is most remote from said first programmable element;
    (c) disabling the switch immediately upstream from said most remote programmable element so that said data is stored in said most remote programmable element;
    (d) again applying data to said first programmable element so that said data passes through all of said programmable elements preceded in said series by enabled switches;
    (e) disabling the switch immediately preceding the most recently disabled switch in said series so that data is stored in the programmable element immediately preceding said most recently disabled switch in said series; and
    (f) repeating steps (d) and (e) until data is stored in all of said programmable elements.

11. The method defined in claim 10 further comprising the step of:
    detecting the data in said programmable element which is most remote from said first programmable element in response to performance of step (b) in order to test whether or not said series is properly passing data.

* * * * *